(12) United States Patent
Murakoshi et al.

(10) Patent No.: US 9,082,703 B2
(45) Date of Patent: Jul. 14, 2015

(54) NONVOLATILE SEMICONDUCTOR MEMORY DEVICE, METHOD FOR MANUFACTURING SAME, AND MANUFACTURING APPARATUS

(71) Applicant: Kabushiki Kaisha Toshiba, Minato-ku (JP)

(72) Inventors: Atsushi Murakoshi, Mie-ken (JP); Keiichi Sawa, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/166,998

(22) Filed: Jan. 29, 2014

(65) Prior Publication Data
US 2015/0069493 A1    Mar. 12, 2015

Related U.S. Application Data

(60) Provisional application No. 61/876,402, filed on Sep. 11, 2013.

(51) Int. Cl.
*H01L 21/02* (2006.01)
*H01L 21/28* (2006.01)
*H01L 29/423* (2006.01)
*H01L 29/51* (2006.01)

(52) U.S. Cl.
CPC .... *H01L 21/28273* (2013.01); *H01L 29/42324* (2013.01); *H01L 29/511* (2013.01)

(58) Field of Classification Search
USPC ............... 257/316, 326, 410; 438/587, 593
See application file for complete search history.

(56) References Cited

U.S. PATENT DOCUMENTS

| | | | |
|---|---|---|---|
| 7,507,652 B2 | 3/2009 | Cho et al. | |
| 7,629,642 B2 | 12/2009 | Ohba | |
| 7,863,119 B2 | 1/2011 | Matsushita et al. | |
| 8,211,811 B2 | 7/2012 | Matsushita et al. | |
| 2003/0001218 A1* | 1/2003 | Takagi | 257/410 |
| 2009/0184366 A1* | 7/2009 | Ozawa | 257/326 |

FOREIGN PATENT DOCUMENTS

JP    2010-182822    8/2010

* cited by examiner

*Primary Examiner* — Errol Fernandes
(74) *Attorney, Agent, or Firm* — Oblon, McClelland, Maier & Neustadt, L.L.P.

(57) ABSTRACT

According to one embodiment, a nonvolatile semiconductor memory device includes: a semiconductor layer; a first insulating film provided on the semiconductor layer; a floating gate layer provided on the first insulating film; a second insulating film provided on the floating gate layer; and a gate electrode provided on the second insulating film, the first insulating film including silicon, oxygen, and carbon. Concentration of the carbon in a direction from the semiconductor layer side toward the floating gate layer side has a maximum between the semiconductor layer and the floating gate layer, and the maximum being located nearer to the semiconductor layer side than to the floating gate layer side.

6 Claims, 18 Drawing Sheets

FIRST EMBODIMENT

SECOND EXAMPLE

NONVOLATILE SEMICONDUCTOR MEMORY DEVICE, METHOD FOR MANUFACTURING SAME, AND MANUFACTURING APPARATUS

CROSS-REFERENCE TO RELATED APPLICATIONS

This application is based upon and claims the benefit of priority from U.S. Provisional Patent Application 61/876,402, filed on Sep. 11, 2013; the entire contents of which are incorporated herein by reference.

FIELD

Embodiments described herein relate generally to a nonvolatile semiconductor device, a method for manufacturing the same and a manufacturing apparatus.

BACKGROUND

In a nonvolatile semiconductor memory device, for instance, a tunnel insulating film is provided on a semiconductor substrate. A floating gate layer is provided on the tunnel insulating film. A block insulating film is provided on the floating gate layer. A gate electrode is provided on the block insulating film.

From the viewpoint of writing characteristics, it is desirable to achieve a high electron injection efficiency of injecting electrons from the semiconductor substrate through the tunnel insulating film into the floating gate layer. On the other hand, from the viewpoint of charge retention characteristics, it is desirable that the electrons accumulated in the floating gate layer be prevented from flowing through the tunnel insulating film to the semiconductor substrate as much as possible. There is demand for a nonvolatile semiconductor memory device having both of these characteristics.

DETAILED DESCRIPTION

Figure 1A:
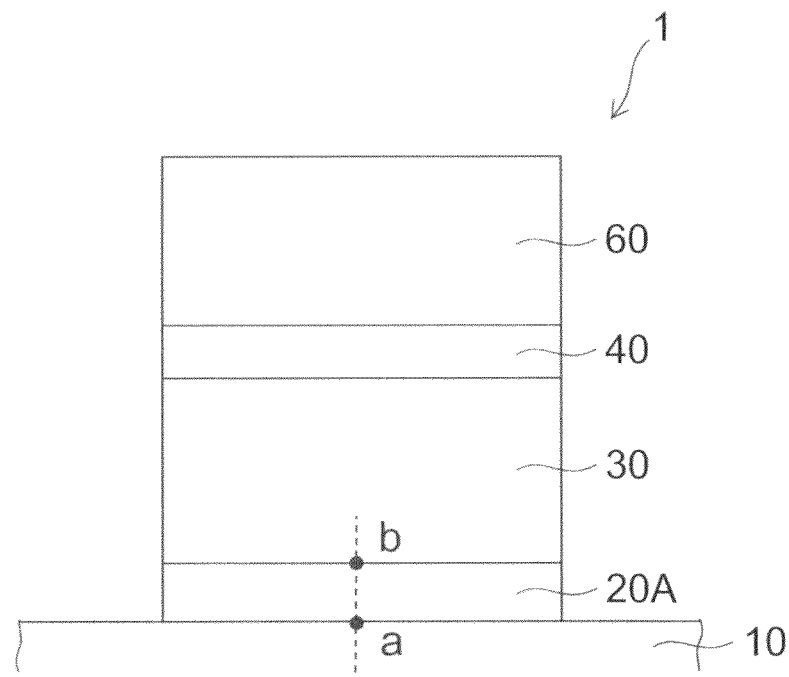
FIG. 1A is a schematic sectional view showing a nonvolatile semiconductor memory device according to a first embodiment.

In general, according to one embodiment, a nonvolatile semiconductor memory device includes: a semiconductor layer; a first insulating film provided on the semiconductor layer; a floating gate layer provided on the first insulating film; a second insulating film provided on the floating gate layer; and a gate electrode provided on the second insulating film, the first insulating film including silicon, oxygen, and carbon. Concentration of the carbon in a direction from the semiconductor layer side toward the floating gate layer side has a maximum between the semiconductor layer and the floating gate layer, and the maximum being located nearer to the semiconductor layer side than to the floating gate layer side.

Embodiments will now be described with reference to the drawings. In the following description, like members are labeled with like reference numerals. The description of the members once described is omitted appropriately.
(First Embodiment)

Figure 1B:
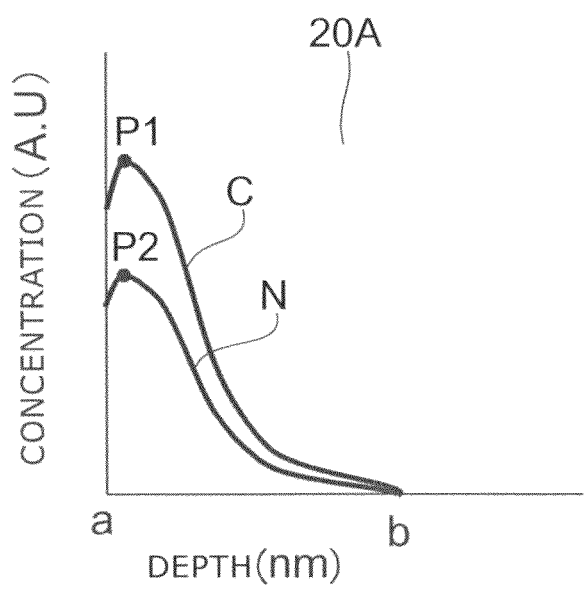
FIG. 1B shows concentration profiles of carbon and nitrogen in the insulating layer of the nonvolatile semiconductor memory device according to the first embodiment.

FIG. 1A is a schematic sectional view showing a nonvolatile semiconductor memory device according to a first embodiment. FIG. 1B shows concentration profiles of carbon and nitrogen in the insulating layer of the nonvolatile semiconductor memory device according to the first embodiment.

In the nonvolatile semiconductor memory device 1 shown in FIG. 1A, a gate insulating film 20A (first insulating film) is provided on a semiconductor layer 10. The gate insulating film 20A can tunnel charge (e.g., electrons) between the semiconductor layer 10 and the floating gate layer 30. On the gate insulating film 20A, a floating gate layer 30 is provided. The floating gate layer 30 can accumulate charge tunneled from the semiconductor layer 10 through the gate insulating film 20A. On the floating gate layer 30, a gate insulating film 40 (second insulating film) is provided. On the gate insulating film 40, a gate electrode 60 is provided. The gate electrode 60 functions as a control gate electrode for writing charge to the floating gate layer 30 and reading the charge written in the floating gate layer 30.

The cell including the semiconductor layer 10, the gate insulating film 20A, the floating gate layer 30, the gate insulating film 40, and the gate electrode 60 is referred to as memory cell.

The material of the semiconductor layer 10 is e.g. silicon crystal. The gate insulating film 20A includes e.g. silicon (Si), oxygen (O), carbon (C), and nitrogen (N). For instance, the gate insulating film 20A includes silicon oxide ($SiO_2$) in which carbon or nitrogen is contained. The material of the floating gate layer 30 is polysilicon (poly-Si) or the like.

The gate insulating film 40 may be e.g. a monolayer of silicon oxide film or silicon nitride film, or may be a stacked film of either silicon oxide film or silicon nitride film. For instance, the gate insulating film 40 may be what is called an ONO film (silicon oxide film/silicon nitride film/silicon oxide film). The material of the gate electrode 60 is e.g. tungsten, tungsten nitride or the like.

As shown in FIG. 1B, in the direction from the semiconductor layer 10 side toward the floating gate layer 30 side (the direction from point a toward point b), the concentration of carbon (C) has a maximum between the semiconductor layer 10 and the floating gate layer 30. That is, the concentration profile of carbon (C) in the direction from the semiconductor layer 10 side toward the floating gate layer 30 side (the direction from point a toward point b) has a peak P1 maximized between the semiconductor layer 10 and the floating gate layer 30. The peak P1 in the concentration profile is located nearer to the semiconductor layer 10 side than to the floating gate layer 30 side. The number of such peaks is one. The carbon concentration at the position of the peak P1 is e.g. $1 \times 10^{19}$ atoms/$cm^3$ or more.

The concentration profile of nitrogen (N) in the direction from the semiconductor layer 10 side toward the floating gate layer 30 side has a maximum between the semiconductor layer 10 and the floating gate layer 30. That is, the concentration profile of nitrogen (N) in the direction from the semiconductor layer 10 side toward the floating gate layer 30 side has a peak P2 maximized between the semiconductor layer 10 and the floating gate layer 30. The peak P2 in this concentration profile is located nearer to the semiconductor layer 10 side than to the floating gate layer 30 side.

FIGS. 2A to 2D are schematic sectional views showing a process for manufacturing a nonvolatile semiconductor memory device according to the first embodiment.

Figure 2A:
FIGS. 2A to 2D are schematic sectional views showing a process for manufacturing a nonvolatile semiconductor memory device according to the first embodiment.

First, a semiconductor layer 10 (e.g., semiconductor wafer) shown in FIG. 2A is prepared. The surface of this semiconductor layer 10 may be subjected to dilute hydrofluoric acid (DHF) treatment to remove natural oxide film.

Figure 2B:
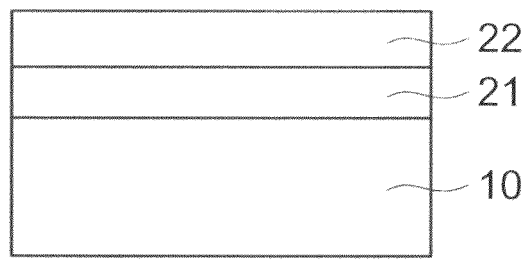

Next, as shown in FIG. 2B, on the semiconductor layer 10, by CVD (chemical vapor deposition), a silicon oxide-containing layer 21 (first silicon oxide-containing layer) containing carbon and nitrogen is formed. For instance, for the raw material gas, $SiH_4$ is used as a silicon-containing gas. Besides, $C_2H_4$ (ethylene), or $C_2H_2$ (acetylene) is used as a carbon-containing gas, and $NH_3$ (ammonia) is used as a nitrogen-containing gas. The film formation temperature is 300° C.

Here, the concentration ratio of the raw material gases is appropriately changed by the film formation time to provide a gradient in the carbon concentration or nitrogen concentration in the depth direction of the silicon oxide-containing layer 21. The film thickness of the silicon oxide-containing layer 21 is 1.5 nm.

Subsequently, on the silicon oxide-containing layer 21, by CVD, an amorphous silicon-containing layer 22 is formed. For the raw material gas, for instance, $Si_2H_6$ is used. The film thickness of the amorphous silicon-containing layer 22 is e.g. 2 nm. The atmosphere pressure is e.g. 1 torr.

Figure 2C:
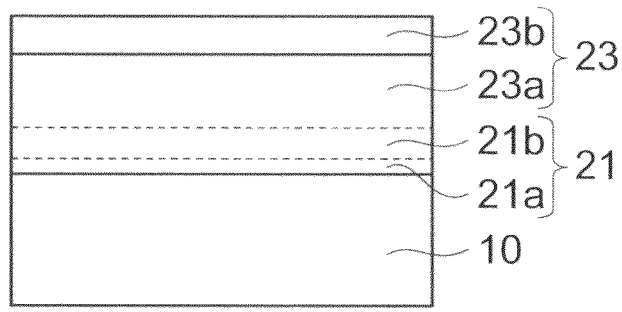

Next, as shown in FIG. 2C, in the atmosphere of an oxygen-containing gas (e.g., water vapor), the semiconductor layer 10, the silicon oxide-containing layer 21, and the amorphous silicon-containing layer 22 are heated at a temperature of e.g. 750° C. or less (e.g., 600° C.). The atmosphere pressure is e.g. 1 torr.

By this heating, the amorphous silicon-containing layer 22 transitions to a silicon oxide-containing layer 23 (second silicon oxide-containing layer).

Actually, by this heating, besides oxidation of the amorphous silicon-containing layer 22, interdiffusion of silicon and oxygen occurs between the semiconductor layer 10 and the silicon oxide-containing layer 21, and between the silicon oxide-containing layer 21 and the silicon oxide-containing layer 23. Thus, FIG. 2C shows that the silicon oxide-containing layer 21 includes a first portion 21a on the semiconductor layer 10 side and a second portion 21b on the silicon oxide-containing layer 23 side. The first portion 21a and the second portion 21b are both silicon oxide-containing layers, although the composition ratio is slightly different.

Furthermore, the silicon oxide-containing layer 23 includes a first portion 23a on the silicon oxide-containing layer 21 side and a second portion 23b in which oxidation has failed to sufficiently proceed at a temperature of 600° C. If a memory cell is formed in the presence of the second portion 23b, shallow levels preferentially causing electron traps (hole-rich region) are formed in the second portion 23b and adversely affect the operating characteristics of the memory cell.

Thus, in the first embodiment, a second round of oxidation heating treatment is performed.

Figure 2D:
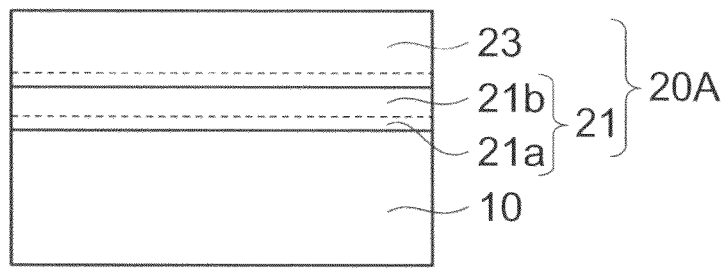

For instance, as shown in FIG. 2D, the semiconductor layer 10, the silicon oxide-containing layer 21, and the silicon oxide-containing layer 23 are again subjected to oxidation heating at a temperature higher than a temperature of 750° C. or less.

For instance, in the atmosphere of an oxygen-containing gas (e.g., water vapor), the semiconductor layer 10, the silicon oxide-containing layer 21, and the silicon oxide-containing layer 23 are heated at a temperature higher than a temperature of 750° C. or less. The temperature higher than a temperature of 750° C. or less is e.g. a temperature of 850° C. or more and 950° C. or less.

For instance, in the first embodiment, at a temperature of 900° C., in the atmosphere of the oxygen-containing gas, the semiconductor layer 10, the silicon oxide-containing layer 21, and the silicon oxide-containing layer 23 are heated.

Thus, a gate insulating film 20A including the silicon oxide-containing layer 21 and the silicon oxide-containing layer 23 is formed. Subsequently, on the gate insulating film 20A, a floating gate layer 30, a gate insulating film 40, and a gate electrode 60 are formed (FIG. 1A).

Figure 3:
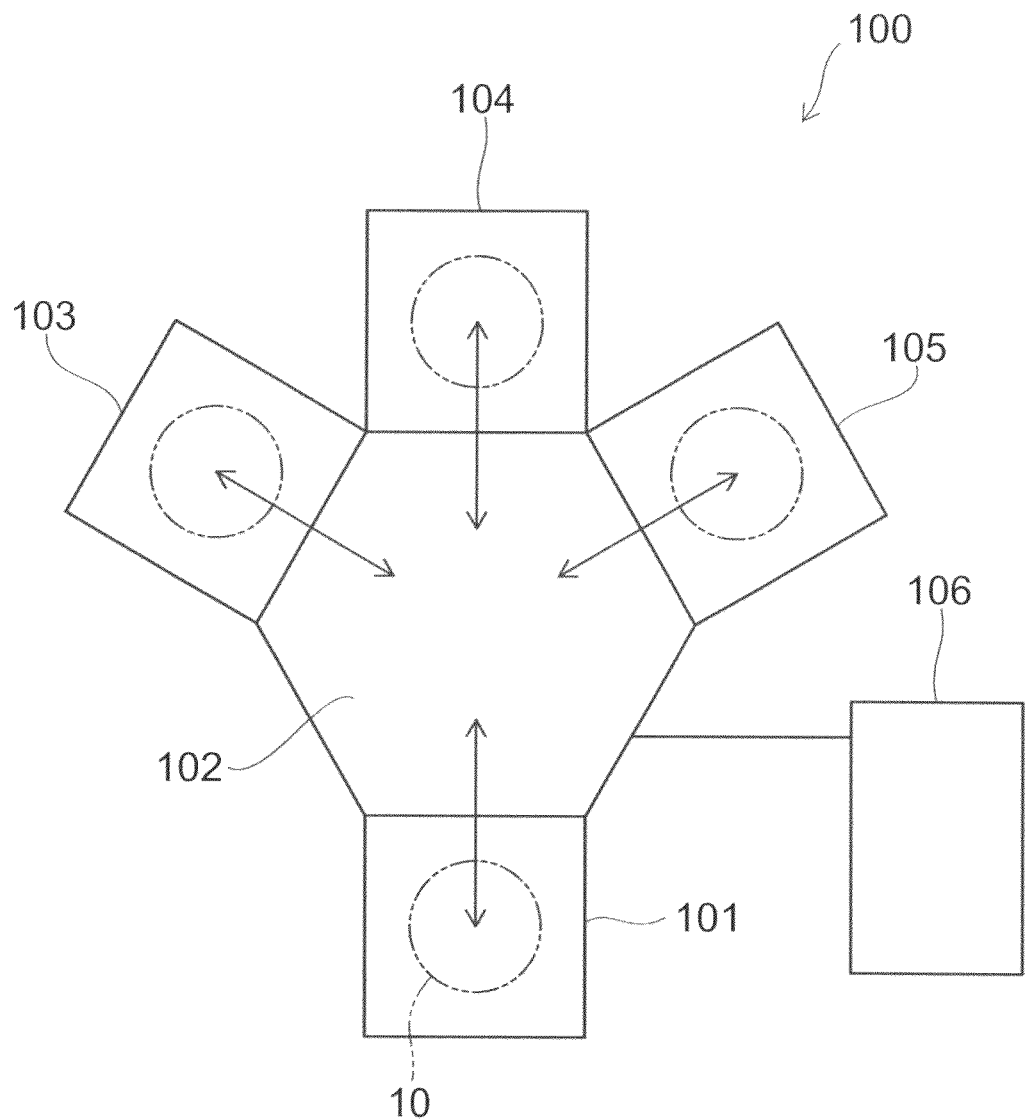
FIG. 3 is a schematic view showing a manufacturing apparatus for manufacturing a nonvolatile semiconductor memory device according to the first embodiment.

FIG. 3 is a schematic view showing a manufacturing apparatus for manufacturing a nonvolatile semiconductor memory device according to the first embodiment.

The manufacturing apparatus 100 includes a load lock chamber 101, a transport chamber 102, a first film formation chamber 103, a second film formation chamber 104, a heating chamber 105, and a control device 106.

In the load lock chamber 101, the semiconductor layer 10 such as a semiconductor wafer is loaded and unloaded. By a transport arm (not shown) provided in the transport chamber 102, the semiconductor layer 10 is transported to the load lock chamber 101, the first film formation chamber 103, the second film formation chamber 104, and the heating chamber 105.

In the first film formation chamber 103, on the semiconductor layer 10, a silicon oxide-containing layer 21 containing carbon and nitrogen can be formed. In the second film formation chamber 104, on the silicon oxide-containing layer 21, an amorphous silicon-containing layer 22 can be formed. In the heating chamber 105, in the atmosphere of an oxygen-containing gas, the semiconductor layer 10, the silicon oxide-containing layer 21, and the amorphous silicon-containing layer 22 can be heated. Furthermore, by the control device 106, the temperature in the heating chamber 105 can be controlled to a temperature of 750° C. or less, or to a temperature higher than a temperature of 750° C. or less. In the manufacturing apparatus 100, the first film formation chamber 103, the second film formation chamber 104, and the heating chamber 105 are independently provided in order to adjust the carbon concentration or nitrogen concentration in the silicon oxide-containing layer 21.

The control section 106 can cause a silicon oxide-containing layer 21 containing carbon and nitrogen to be formed on the semiconductor layer 10 in the first film formation chamber 103. The control section 106 can cause an amorphous silicon-containing layer 22 to be formed on the silicon oxide-containing layer 21 in the film formation chamber 104. The control section 106 can cause the semiconductor layer 10, the silicon oxide-containing layer 21, and the amorphous silicon-containing layer 22 to be heated at a first temperature, and then heated at a second temperature higher than the first temperature, in the atmosphere of an oxygen-containing gas in the heating chamber 105.

In the control section 106, a program is stored in a computer. The program can execute forming a silicon oxide-containing layer 21 containing carbon and nitrogen on the semiconductor layer 10 in the first film formation chamber 103, forming an amorphous silicon-containing layer 22 on the silicon oxide-containing layer 21 in the film formation chamber 104, and causing the semiconductor layer 10, the silicon oxide-containing layer 21, and the amorphous silicon-containing layer 22 to be heated at a first temperature, and then heated at a second temperature higher than the first temperature, in the atmosphere of an oxygen-containing gas in the heating chamber 105. This program can also be recorded in a medium.

Before describing the function and effect of the nonvolatile semiconductor memory device 1 including the gate insulating film 20A, the reason for using silicon oxide rather than what is called a high-k material as the material of the gate insulating film 20A is described.

Figure 4A:
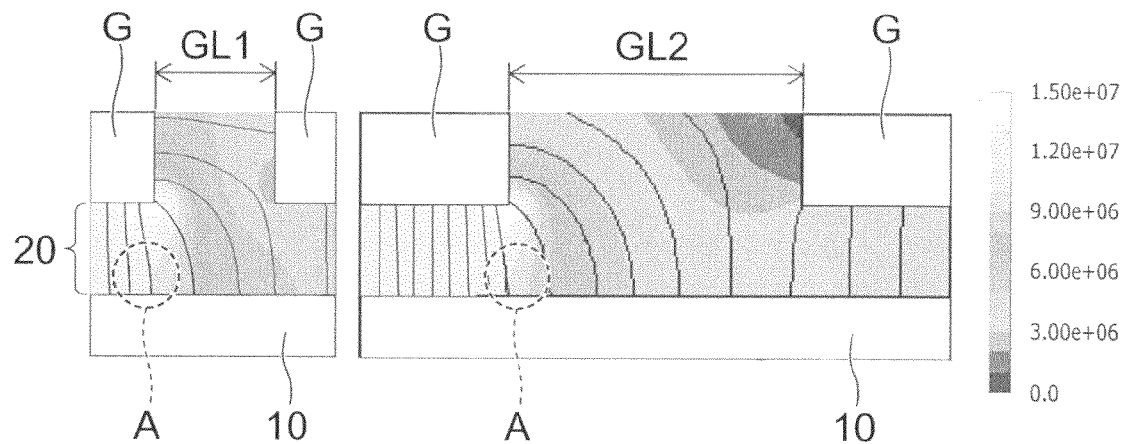
FIG. 4A shows lines of electric force around the gate electrodes.
Figure 4B:
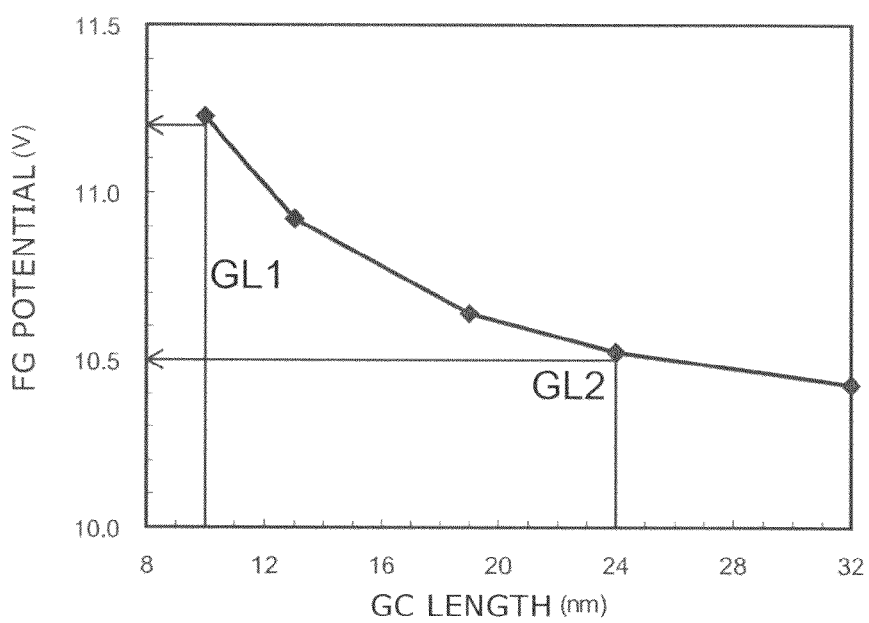
FIG. 4B shows the relation of the distance between adjacent gate electrodes to the potential of the floating gate layer.

FIG. 4A shows lines of electric force around the gate electrodes. FIG. 4B shows the relation of the distance between adjacent gate electrodes to the potential of the floating gate layer.

FIG. 4A shows two adjacent gate electrodes G, a gate insulating film 20, and a semiconductor layer 10, and shows lines of electric force and electric field intensity around the gate electrodes G. Here, a darker shade means a stronger electric field intensity. The gate insulating film 20 is a silicon oxide film.

In FIG. 4A, the distance GL1 between the adjacent gate electrodes G on the left side is 10 nm. The distance GL2 between the adjacent gate electrodes G on the right side is 24 nm. The distance between the adjacent gate electrodes may be referred to as gate length.

As seen from FIG. 4A, at the surface of the semiconductor layer 10, there is a site where the electric field is weak near the end of the gate electrode G. In FIG. 4A, the place where the electric field is weak is enclosed with a dashed line indicated by arrow A. The occupancy ratio of the portion enclosed with this dashed line increases as the gate length becomes shorter. This means that as the gate length becomes shorter, that is, as the miniaturization proceeds, the density of the tunnel current flowing in the gate insulating film 20 becomes smaller.

In FIG. 4B, the horizontal axis represents the gate length (nm), and the vertical axis represents the potential (V) of the floating gate layer.

As the gate length becomes shorter, the density of the tunnel current flowing in the gate insulating film 20 becomes smaller. Thus, as the gate length becomes shorter, a higher write potential (program potential) is required.

For instance, at write time, when the gate length GL2 is 24 nm, a potential (V) of the floating gate layer 30 of 10.5 V is required. On the other hand, when the gate length GL1 is 10 nm, a potential (V) of the floating gate layer 30 of 11.2 V is required. In terms of the write potential of the gate electrode G, this potential difference corresponds to a difference of 1.1 V. That is, as the gate length becomes shorter, a higher write potential is required.

One measure for avoiding this problem is to form the gate insulating film 20 (silicon oxide film) more thinly. If the gate insulating film 20 is formed more thinly, the electric field intensity near the end of the gate electrode G can be made stronger.

However, from the viewpoint of breakdown voltage and prevention of leakage current, it is difficult to thin the silicon oxide film. Thus, it is more advantageous to use a high-k material as the material of the gate insulating film 20.

Figure 5:
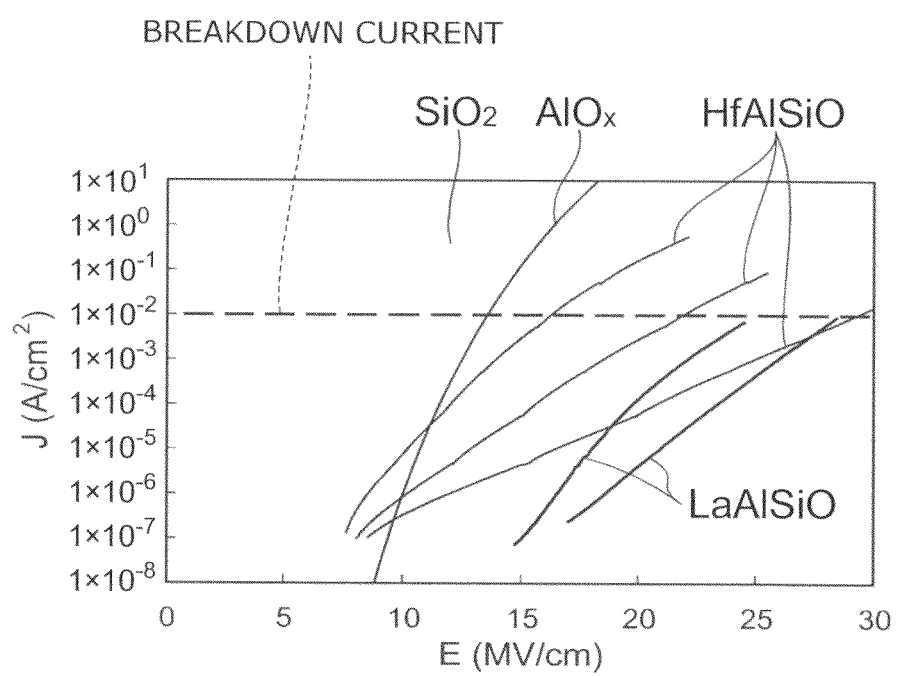
FIG. 5 shows the relationship between the electric field intensity and the leakage current.

FIG. 5 shows the relationship between the electric field intensity and the leakage current.

In FIG. 5, the horizontal axis represents the intensity of electric field E (MV/cm) applied to the gate insulating film. The vertical axis represents the leakage current J (A/cm$^2$). Here, the breakdown current is set to J=1×10$^{-2}$ A/cm$^2$.

The figure shows the relationship between the electric field intensity and the leakage current for SiO$_2$ film, high-k films such as HfAlSiO film and LaAlSiO film, and AlO$_x$ film.

As shown in FIG. 5, the SiO$_2$ film has a breakdown voltage of approximately 10 MV/cm. However, at an electric field intensity of 10 MV/cm or more, the SiO$_2$ film may lead to breakdown. On the other hand, the high-k films such as HfAlSiO film and LaAlSiO film have higher breakdown voltage (e.g., 15 MV/cm or more) than the SiO$_2$ film.

However, it is found that for the high-k films, also at 20 MV/cm or less, the leakage current is not very different from that for the SiO$_2$ film. The reason for this is considered as follows. In the high-k film, oxygen deficiency exists in the film. Thus, due to the effect of fixed charge in the film, charge trap sites are formed in the film.

On the other hand, the AlO$_x$ film has higher breakdown voltage than the SiO$_2$ film. However, Al ions have large diffusion coefficient in the oxide film. Thus, forming an AlO$_x$ film on the semiconductor layer 10 is not desirable for the characteristics of the nonvolatile semiconductor memory device.

Figure 6A:
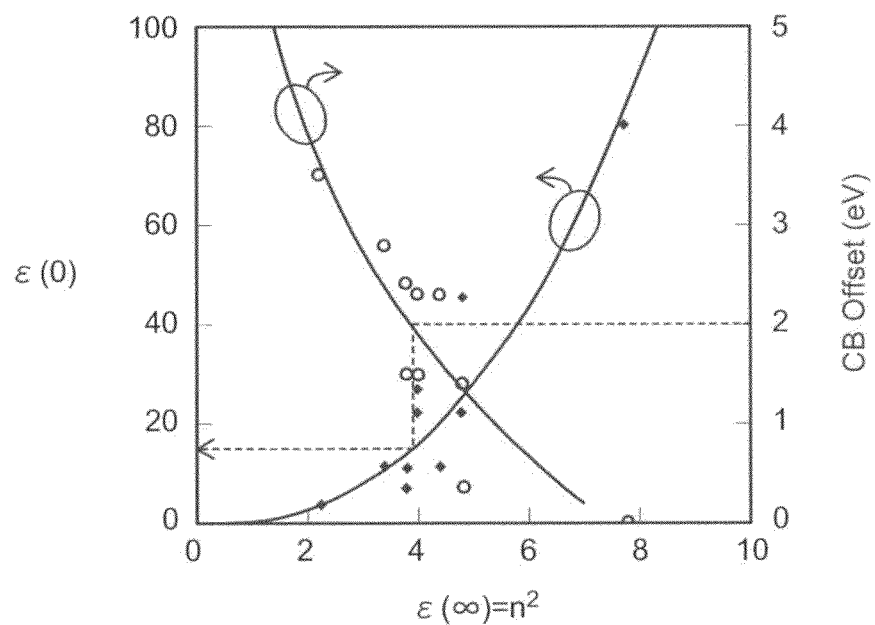
FIG. 6A shows the relationship between refractive index and permittivity, and the relationship between refractive index and offset of the energy barrier between the gate insulating film and the semiconductor layer.
Figure 6B:
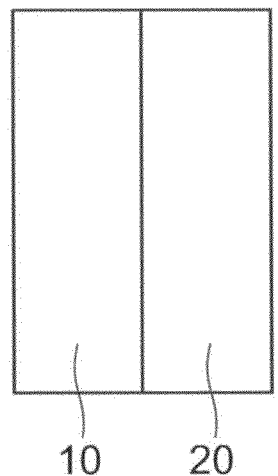
FIG. 6B shows the junction of the gate insulating film and the semiconductor layer.

FIG. 6A shows the relationship between refractive index and permittivity, and the relationship between refractive index and offset of the energy barrier between the gate insulating film and the semiconductor layer. FIG. 6B shows the junction of the gate insulating film and the semiconductor layer.

In FIG. 6A, the horizontal axis represents relative permittivity $\epsilon(\infty)$ (refractive index ($n^2$)). The left vertical axis represents permittivity $\epsilon(0)$. The right vertical axis represents offset of the energy barrier (electron barrier) (eV) between the gate insulating film 20 and the semiconductor layer 10.

Here, in the model based on the result of FIG. 6A, a high-k film is used as the gate insulating film 20. This high-k film contains a metal such as Hf. Thus, assuming that the gate insulating film 20 is a conduction band, it is assumed that a Schottky barrier is formed between the semiconductor layer 10 and the gate insulating film 20.

As shown in FIG. 6A, the relationship between relative permittivity and offset of the energy barrier indicates that as the relative permittivity $\epsilon(\infty)$ becomes higher, the amount of offset becomes smaller. This means that as the relative permittivity $\epsilon(\infty)$ becomes higher, the leakage current resulting from interface levels between the semiconductor layer 10 and the gate insulating film 20 increases.

On the other hand, for memory characteristics, it is assumed that the energy barrier (eV) between the semiconductor layer 10 and the gate insulating film 20 needs to be 2 eV or more. Then, from the result of FIG. 6A, the permittivity $\epsilon(0)$ needs to satisfy $\epsilon(0)<20$. This means that if the energy barrier (eV) is 2 eV or more and the permittivity $\epsilon(0)$ satisfies the condition of $\epsilon(0)<20$, then there is no need to use a high-k material for the gate insulating film 20.

From the foregoing, even if a material including silicon oxide rather than a high-k material is used as the material of the gate insulating film 20, the gate insulating film 20 sufficiently functions as a tunnel insulating film.

Before specifically describing the function and effect of the nonvolatile semiconductor memory device 1, a method for manufacturing a nonvolatile semiconductor memory device according to alternative examples is described.

Figure 7A:
FIGS. 7A and 7B are schematic sectional views showing a process for manufacturing a nonvolatile semiconductor memory device according to a first example.
Figure 7B:
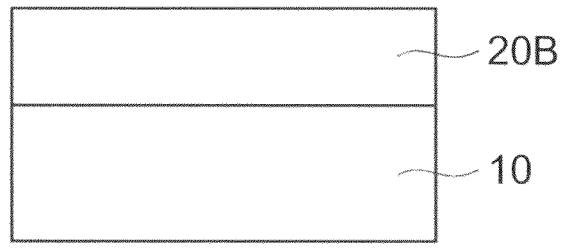

FIGS. 7A and 7B are schematic sectional views showing a process for manufacturing a nonvolatile semiconductor memory device according to a first example.

In the first example, for instance, a semiconductor layer shown in FIG. 7A is prepared. The surface of this semiconductor layer 10 may be subjected to dilute hydrofluoric acid treatment to remove natural oxide film.

Next, as shown in FIG. 7B, in the atmosphere of an oxygen-containing gas (e.g., water vapor), the semiconductor layer 10 is heated at a temperature of e.g. 750° C. or less. By this heating, the upper layer of the semiconductor layer 10 transitions to a gate insulating film 20B including silicon oxide. Subsequently, on the gate insulating film 20B, a floating gate layer 30, a gate insulating film 40, and a gate electrode 60 are formed to form a memory cell.

Figure 8A:
FIGS. 8A to 8C are schematic sectional views showing a process for manufacturing a nonvolatile semiconductor memory device according to a second example.
Figure 8B:
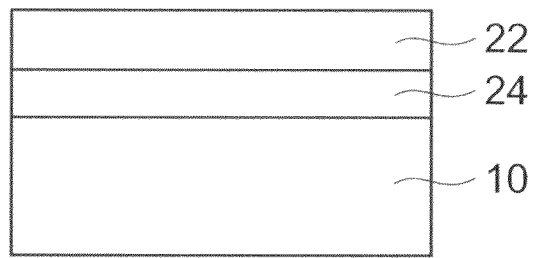
Figure 8C:
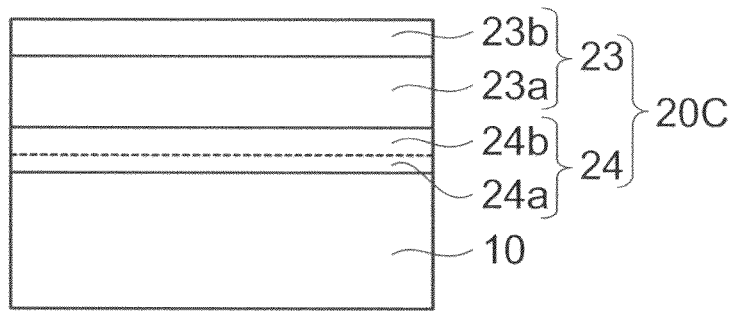

FIGS. 8A to 8C are schematic sectional views showing a process for manufacturing a nonvolatile semiconductor memory device according to a second example.

In the second example, a semiconductor layer 10 shown in FIG. 8A is prepared. The surface of this semiconductor layer 10 may be subjected to dilute hydrofluoric acid (DHF) treatment to remove natural oxide film.

Next, as shown in FIG. 8B, on the semiconductor layer 10, by CVD, a silicon oxide-containing layer 24 is formed. In the second example, for the raw material gas, the carbon-containing gas and the nitrogen-containing gas are not used. The film formation temperature is 400° C. The film thickness of the silicon oxide-containing layer 24 is 1 nm.

Subsequently, on the silicon oxide-containing layer 24, by CVD, an amorphous silicon-containing layer 22 is formed.

For the raw material gas, for instance, $Si_2H_6$ is used. The film thickness of the amorphous silicon-containing layer 22 is 2 nm. The atmosphere pressure is e.g. 1 torr.

Next, as shown in FIG. 8C, in the atmosphere of an oxygen-containing gas (e.g., water vapor), the semiconductor layer 10, the silicon oxide-containing layer 24, and the amorphous silicon-containing layer 22 are heated at a temperature of e.g. 600° C. The atmosphere pressure is e.g. 1 torr.

By this heating, the amorphous silicon-containing layer 22 transitions to a silicon oxide-containing layer 23.

Actually, by this heating, besides oxidation of the amorphous silicon-containing layer 22, interdiffusion of silicon and oxygen occurs between the semiconductor layer 10 and the silicon oxide-containing layer 24, and between the silicon oxide-containing layer 24 and the silicon oxide-containing layer 23. Thus, FIG. 8C shows that the silicon oxide-containing layer 24 includes a first portion 24a on the semiconductor layer 10 side and a second portion 24b on the silicon oxide-containing layer 23 side. The first portion 24a and the second portion 24b are both silicon oxide-containing layers.

Furthermore, the silicon oxide-containing layer 23 includes a first portion 23a on the silicon oxide-containing layer 24 side and a second portion 23b in which oxidation has failed to sufficiently proceed at 600° C. In the second example, subsequently, the second round of heating treatment as performed in the first embodiment is not performed. Thus, a gate insulating film 20C including the silicon oxide-containing layer 24 and the silicon oxide-containing layer 23 is formed. Subsequently, on the gate insulating film 20C, a floating gate layer 30, a gate insulating film 40, and a gate electrode 60 are formed to form a memory cell.

Besides the first and second examples, a third example is introduced.

In the third example, after the process of the second example, the semiconductor layer 10, the silicon oxide-containing layer 24, and the silicon oxide-containing layer 23 are heated in a vacuum for 10 seconds at a temperature of 1000° C. In the third example, the second round of heating treatment is not performed in an oxygen-containing gas atmosphere, but the semiconductor layer 10, the silicon oxide-containing layer 24, and the silicon oxide-containing layer 23 are heated in a vacuum. The gate insulating film formed by the process according to the third example is referred to as gate insulating film 20D.

The function and effect of the nonvolatile semiconductor memory device 1 according to the first embodiment is specifically described.

Figure 9:
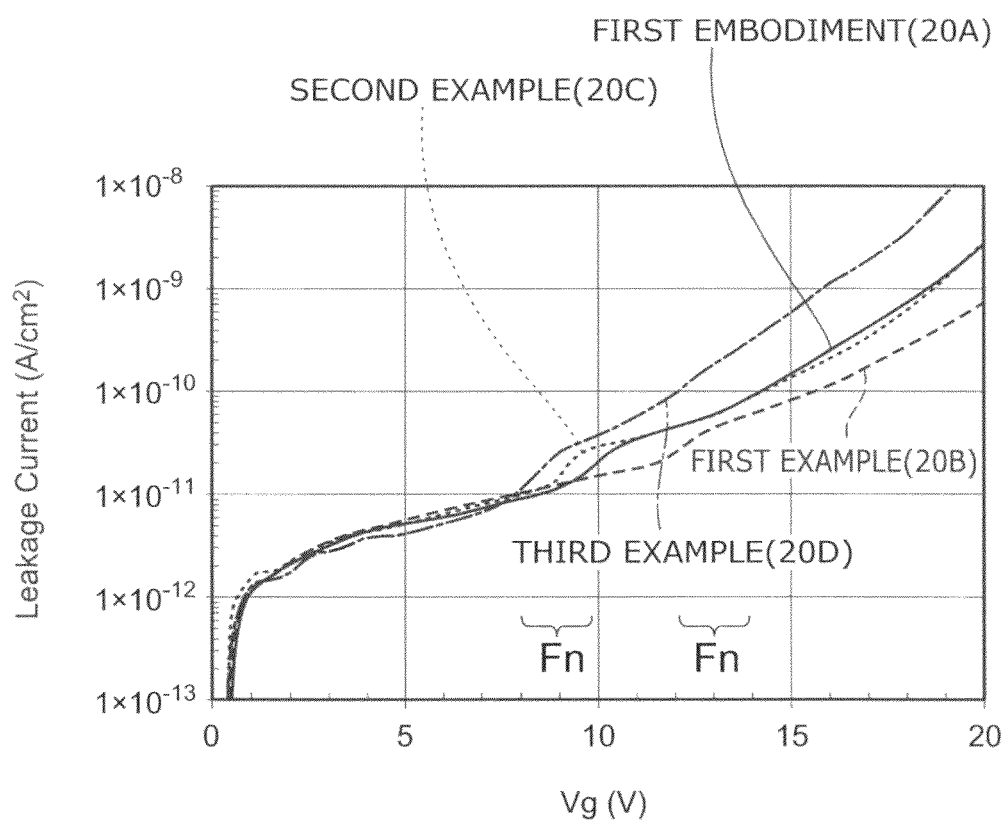
FIG. 9 shows the relationship between the potential of the gate electrode and the leakage current flowing in the gate insulating film.

FIG. 9 shows the relationship between the potential of the gate electrode and the leakage current flowing in the gate insulating film.

In FIG. 9, the horizontal axis represents the voltage (V) of the gate electrode G. The vertical axis represents the leakage current ($A/cm^2$) flowing in the gate insulating film 20A-20D.

As shown in FIG. 9, if the voltage (V) between the gate electrode G and the semiconductor layer 10 is gradually increased from 0 V, then there is an FN (function) region of voltage (V) where the leakage current in the gate insulating film steeply rises. The leakage current at the point of rising in the FN region is referred to as FN current.

That is, by obtaining the FN current, electrons (e) can be passed in the gate insulating film. Thus, electrons (e) can be injected from the semiconductor layer 10 through the gate insulating film into the floating gate layer 30.

The following can be seen from FIG. 9.

In the first example, the FN current occurs when the voltage (V) of the gate electrode G is 12-13 V.

In the second example, the FN current occurs when the voltage (V) of the gate electrode G is 9-9.5 V.

In the third example, the FN current occurs when the voltage (V) of the gate electrode G is 8-9 V.

In the first embodiment, the FN current occurs when the voltage (V) of the gate electrode G is 9-10 V.

That is, in the first example, the voltage (V) of the gate electrode G generating the FN current is the highest. It is found that in the other cases such as the second example, the third example, and the first embodiment, the voltage (V) of the gate electrode G generating the FN current falls within the range of 8-10 V.

That is, it is found that the second example, the third example, and the first embodiment enable writing to the floating gate layer at a lower gate voltage. However, in the third example, compared with the second example and the first embodiment, the breakdown voltage of the gate insulating film is more prone to degradation, and furthermore, the leakage current tends to increase.

Figure 10:
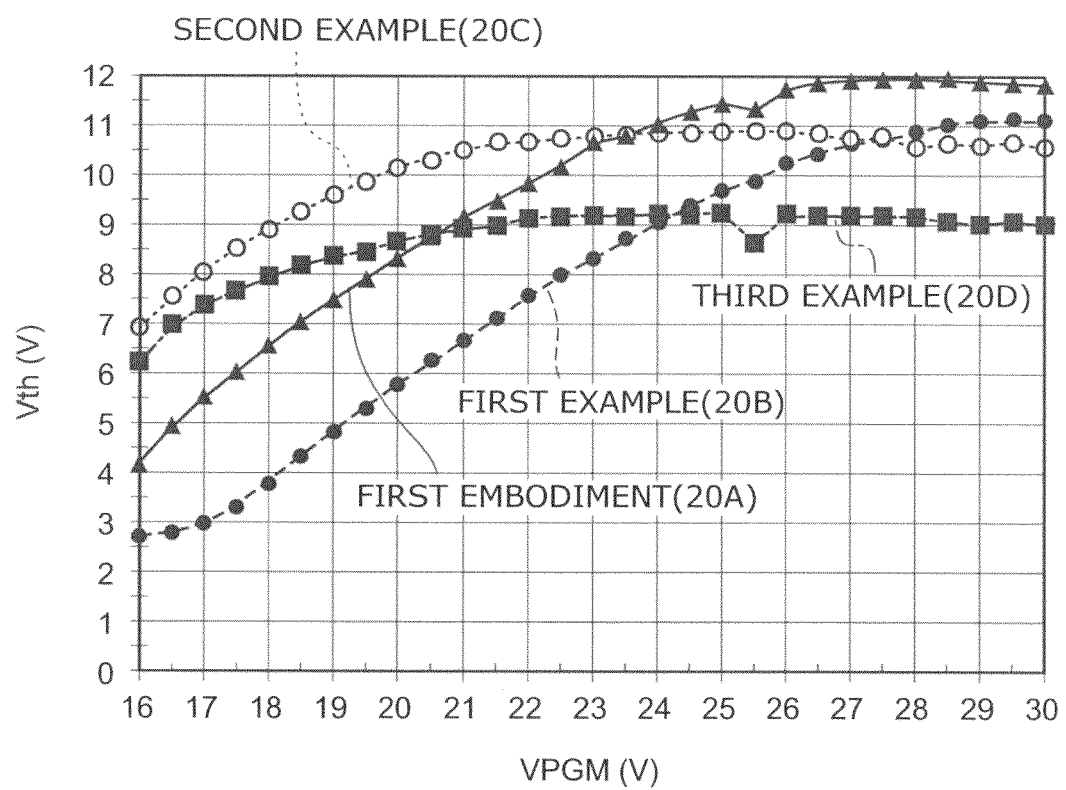
FIG. 10 shows the relationship between write voltage and threshold voltage.

FIG. 10 shows the relationship between write voltage and threshold voltage.

In FIG. 10, the horizontal axis represents write voltage (program voltage) (V). The vertical axis represents the threshold voltage (Vth (V)) of the gate electrode at read time.

The following can be seen from FIG. 10.

In the first example, writing to the floating gate layer has already been possible at a write voltage (V) of 16 V. The threshold voltage (V) is saturated at a write voltage (V) of approximately 28 V or more.

In the second example, writing to the floating gate layer has already been possible at a write voltage (V) of 16 V. The threshold voltage (V) is saturated at a write voltage (V) of approximately 20 V or more.

In the third example, writing to the floating gate layer has already been possible at a write voltage (V) of 16 V. The threshold voltage (V) is saturated at a write voltage (V) of approximately 21 V or more.

On the other hand, in the first embodiment, writing to the floating gate layer has already been possible at a write voltage (V) of 16 V. The threshold voltage (V) is saturated at a write voltage (V) of approximately 22 V or more.

Saturation of the threshold voltage in FIG. 10 means saturation of charge caused by injecting electrons into the floating gate layer. That is, by performing writing to the floating gate layer at the write voltage (V) causing charge saturation, a stable threshold voltage is obtained. This prevents erroneous decision at read time.

It is found that in the first embodiment, the second example, and the third example, the write voltage (V) causing saturation of the threshold voltage is lower than in the first example.

In particular, in the first embodiment, the saturation threshold voltage (V) is higher than in the first example, the second example, and the third example. That is, it is found that in the first embodiment, the setting range of the threshold voltage (V) is wider than in the first to third examples. Here, in the third example, it is found that the threshold voltage causing saturation of the write voltage (V) is easily varied.

Figure 11:
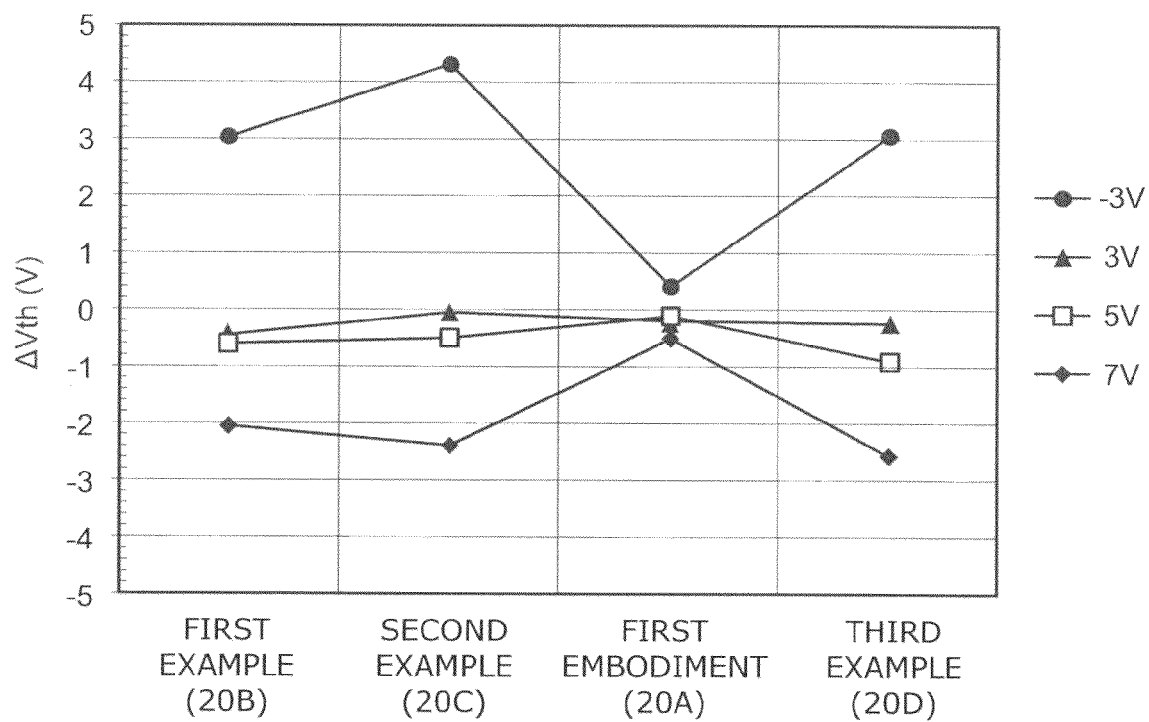
FIG. 11 shows comparison of charge retention characteristics.

FIG. 11 shows comparison of charge retention characteristics.

Writing is performed on the memory cell according to the first embodiment and the first to third examples so that the threshold voltage (V) is set to −3 V, +3 V, +5 V, and +7 V. Then, each memory cell is subjected to a deterioration test. FIG. 11 shows the variation (ΔVth) of the threshold voltage after the deterioration test. Here, in the deterioration test, for instance, the cycle of heating in a water vapor atmosphere at 125° C. for 10 hours is repeated three times.

As seen from FIG. 11, in the first to third examples, variation of the threshold voltage after the deterioration test is intense. However, in the first embodiment, variation of the threshold voltage after the deterioration test scarcely occurs. That is, in the first embodiment, even after the deterioration test, the electrons accumulated in the floating gate layer are released less easily to the outside of the floating gate layer than in the first to third examples.

Thus, it is found that in the gate insulating film 20A according to the first embodiment, electrons easily flow from the semiconductor layer 10 side to the gate electrode side, and do not easily flow from the gate electrode side to the semiconductor layer 10 side.

Figure 12A:
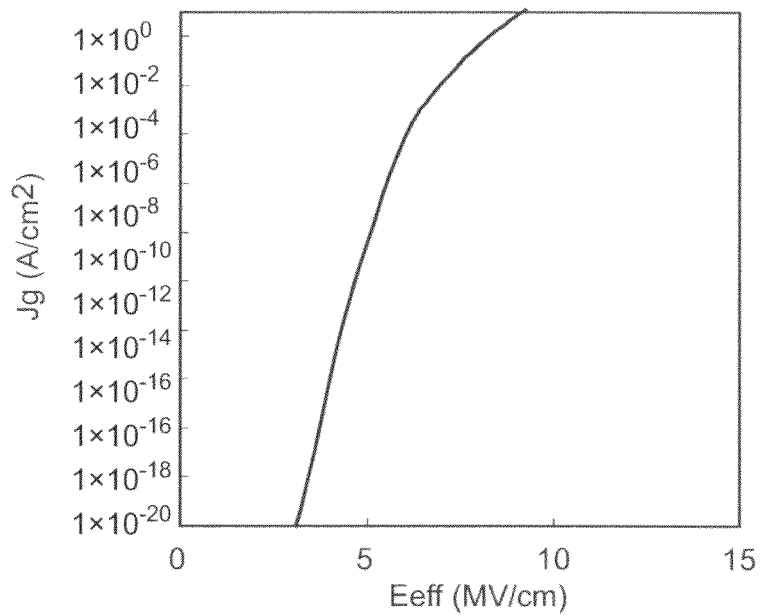
FIG. 12A shows the relationship between electric field intensity and leakage current in the gate insulating film.
Figure 12B:
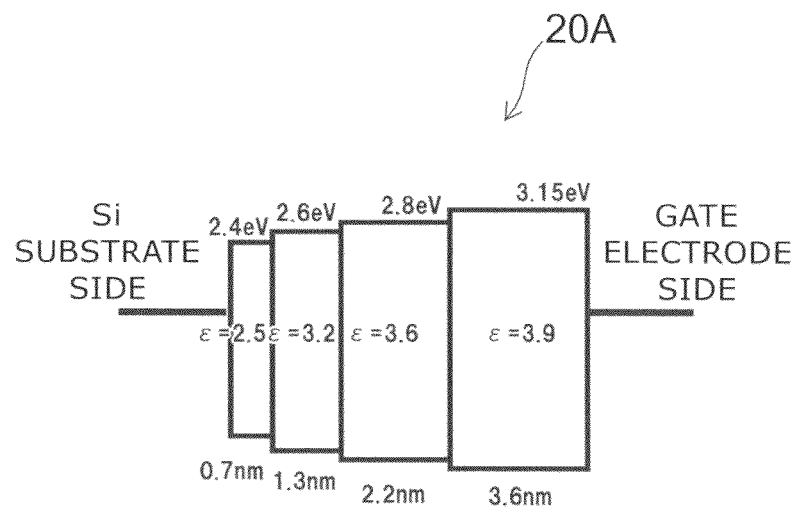
FIG. 12B shows an energy band model of the gate insulating film based on the relationship between electric field intensity and leakage current in the gate insulating film shown in FIG. 12A.

FIG. 12A shows the relationship between electric field intensity and leakage current in the gate insulating film. FIG. 12B shows an energy band model of the gate insulating film based on the relationship between electric field intensity and leakage current in the gate insulating film shown in FIG. 12A.

FIG. 12A shows a J-E curve of the gate insulating film 20A according to the first embodiment. The horizontal axis represents the effective electric field intensity (MV/cm) with the film thickness of the gate insulating film taken into consideration. The vertical axis represents the leakage current ($A/cm^2$) flowing in the gate insulating film.

From the J-E curve shown in FIG. 12A, an energy band model of the gate insulating film 20A is derived by simulation as shown in FIG. 12B.

The gate insulating film 20A shown in FIG. 12B has a stacked structure of a plurality of insulating films. With regard to the permittivity of the gate insulating film 20A, the permittivity at the interface of the gate insulating film 20A in contact with the semiconductor layer 10 is lower than the permittivity at the interface in contact with the gate electrode 60. The permittivity between the gate electrode 60 and the semiconductor layer 10 is higher than or equal to the permittivity at the interface in contact with the semiconductor layer 10, and lower than or equal to the permittivity at the interface in contact with the gate electrode 60.

Specifically, in the energy band, the permittivity decreases stepwise from the gate electrode side toward the semiconductor layer 10 side. The electron barrier decreases stepwise from the gate electrode side toward the semiconductor layer 10 side. Here, the gate electrode can be replaced by the floating gate layer being a conductive layer.

Such a model is in agreement with the effect of the gate insulating film 20A described with reference to FIGS. 9 to 11. That is, the model is in agreement with the following fact. The electron barrier increases stepwise from the semiconductor layer 10 side toward the gate electrode side. Thus, electrons easily flow from the semiconductor layer 10 side to the gate electrode. Furthermore, a high electron barrier is formed between the gate insulating film 20A and the gate electrode. Thus, electrons do not easily flow from the gate electrode side to the semiconductor layer 10.

SIMS profiles of the gate insulating film are described below.

Figure 13:
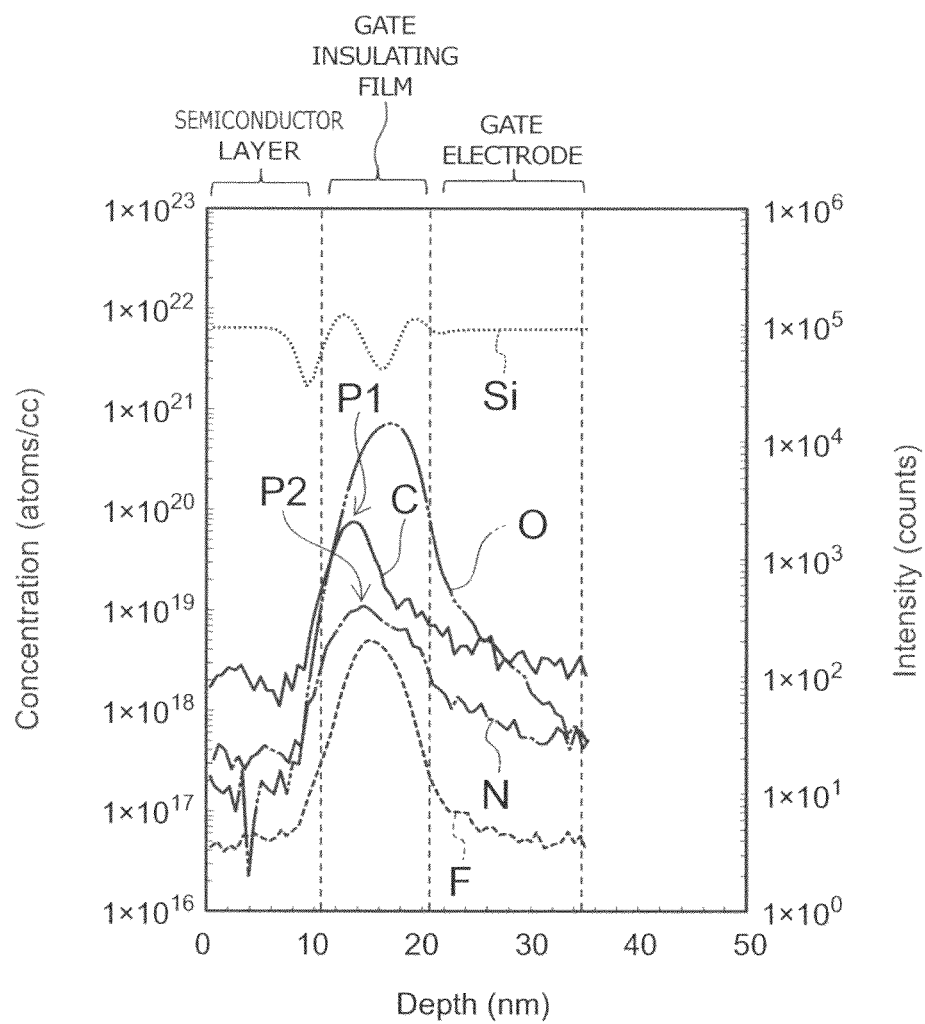
FIG. 13 shows SIMS profiles of the gate insulating film according to the first embodiment.

FIG. 13 shows SIMS profiles of the gate insulating film according to the first embodiment.

In the sample for SIMS characterization, a gate electrode 60 is used instead of the floating gate layer 30. The structure of the characterization sample is a stacked body of semiconductor layer 10/gate insulating film 20A/gate electrode 60.

FIG. 13 shows SIMS profiles of silicon (Si), oxygen (O), carbon (C), nitrogen (N), and fluorine (F) in the direction from the semiconductor layer 10 toward the gate electrode 60.

As shown in FIG. 13, the concentration profile of carbon (C) in the direction from the semiconductor layer 10 side toward the gate electrode 60 side has a peak P1 maximized between the semiconductor layer 10 and the gate electrode 60. It is considered that carbon is introduced in the gate insulating film 20A as e.g. silicon oxycarbide (SiOC).

The peak P1 in the concentration profile is located nearer to the semiconductor layer 10 side than to the gate electrode 60 side. The number of peaks P1 is one. The carbon concentration at the position of the peak P1 is e.g. $1 \times 10^{19}$ atoms/cm$^3$ or more. For instance, the carbon concentration at the position of the peak P1 is $5 \times 10^{19}$ atoms/cm$^3$.

From the peak P1 to the gate electrode 60 side, the carbon concentration gradually decreases. The carbon concentration at the gate electrode 60 side is lower than $1 \times 10^{19}$ atoms/cm$^3$.

The concentration profile of nitrogen (N) in the direction from the semiconductor layer 10 side toward the gate electrode 60 side has a peak P2 maximized between the semiconductor layer 10 and the gate electrode 60. The nitrogen concentration is $3 \times 10^{18}$ atoms/cm$^3$ or more. The peak P2 in this concentration profile is located nearer to the semiconductor layer 10 side than to the gate electrode 60 side. The number of peaks P2 is one. The nitrogen concentration at the position of the peak P2 is e.g. $1 \times 10^{19}$ atoms/cm$^3$.

Figure 14A:
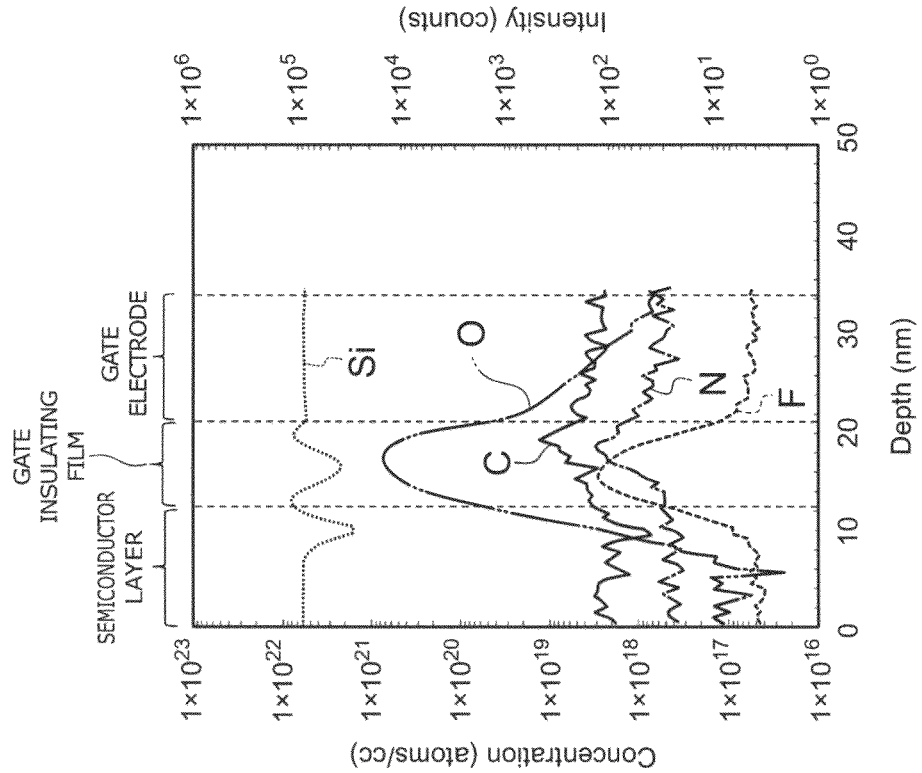
FIG. 14A shows SIMS profiles of the gate insulating film according to the first example.
Figure 14B:
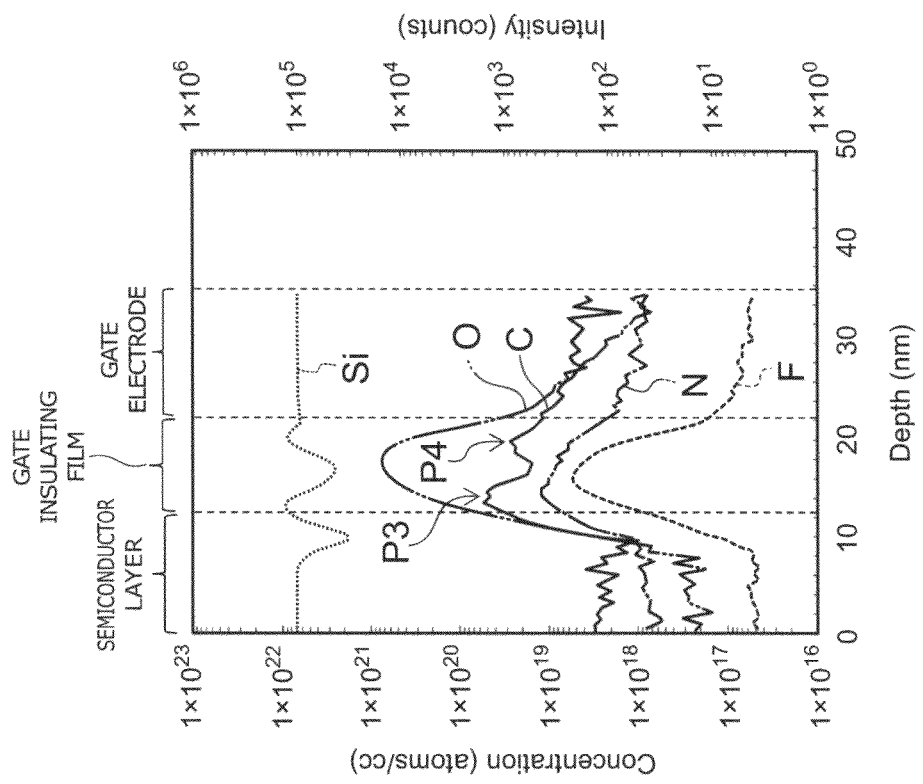
FIG. 14B shows SIMS profiles of the gate insulating film according to the second example.

FIG. 14A shows SIMS profiles of the gate insulating film according to the first example. FIG. 14B shows SIMS profiles of the gate insulating film according to the second example.

As shown in FIG. 14A, in the first example, in the direction from the semiconductor layer 10 side toward the gate electrode 60 side, the carbon concentration and the nitrogen concentration are both $1 \times 10^{19}$ atoms/cm$^3$ or less. In the first example, there is no specific peak.

As shown in FIG. 14B, in the second example, the concentration profile of carbon (C) in the direction from the semiconductor layer 10 side toward the gate electrode 60 side has a peak P3 and a peak P4 between the semiconductor layer 10 and the gate electrode 60. That is, the number of peaks is two. The carbon concentration is $1 \times 10^{19}$ atoms/cm$^3$ or more in the gate insulating film 20C.

In this embodiment, the peak of SIMS analysis is defined as follows.

For instance, a concentration profile is obtained with the depth (nm) of film thickness on the horizontal axis and the carbon concentration or nitrogen concentration (atoms/cm$^3$) on the vertical axis. In this case, in this concentration profile, a peak is defined as a maximum in the waveform profile curve with the full width at half maximum being one third (⅓) or more of the film thickness d. For instance, in the embodiment, when the film thickness d of the gate insulating film 20A is 6 nm, a peak is defined as a maximum in the waveform profile curve having a full width at half maximum of 2 nm or more in the concentration profile.

Thus, in the concentration profile curve, fine peaks formed by vertical oscillation like noise are not included in the peaks in this embodiment.

For instance, in FIG. 13, the carbon concentration has a profile from the semiconductor layer 10 side to the gate electrode 60 as follows.

For instance, the concentration profile of carbon steeply rises near a depth of 8 nm, and once reaches a peak P1. After passing through the peak P1, the concentration profile of carbon tends to decrease gradually. The concentration profile of carbon exhibits a history oscillating vertically like noise at a depth of 16 nm. This is not included in the peaks by the aforementioned definition.

Thus, in FIG. 13, the concentration profile of carbon in the gate insulating film has one peak P1. Similarly, the concentration profile of nitrogen in the gate insulating film has one peak P2.

In contrast, in FIG. 14B, the carbon concentration has a profile from the semiconductor layer 10 side to the gate electrode 60 as follows.

For instance, the concentration profile of carbon steeply rises near a depth of 8 nm, and once reaches a peak P3. After passing through the peak P3, the concentration in the concentration profile of carbon decreases. However, at a depth of 18 nm, the concentration profile of carbon steeply rises again and reaches a peak P4. Then, after passing through the peak P4, the concentration profile of carbon tends to decrease. The concentration profile of carbon exhibits a history oscillating vertically like noise near the peaks P3 and P4. This is not included in the peaks by the aforementioned definition.

Thus, in FIG. 14B, the concentration profile of carbon in the gate insulating film has two peaks P3 and P4.

Figure 15A:
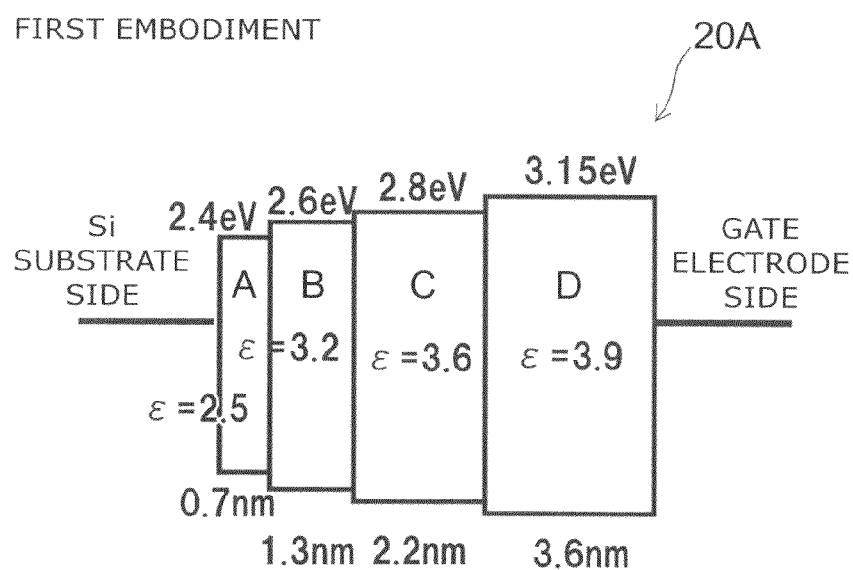
FIG. 15A shows an energy band model of the gate insulating film according to the first embodiment.
Figure 15B:
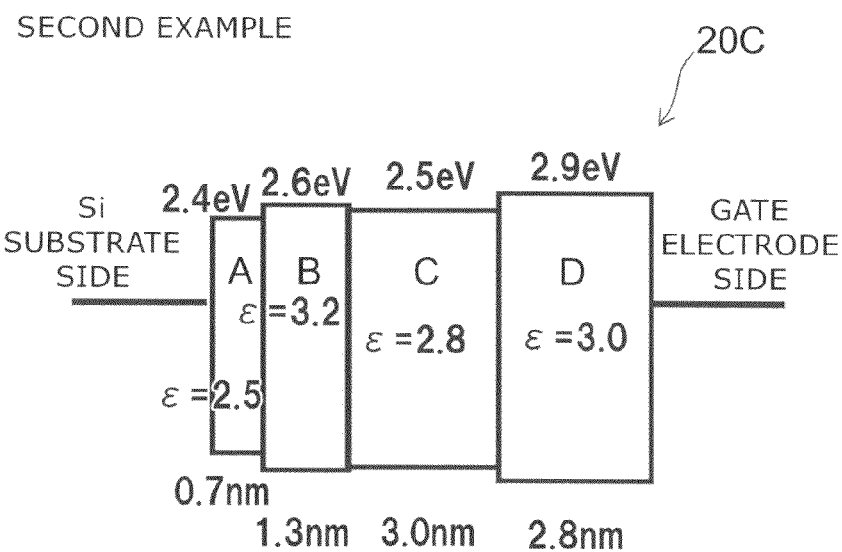
FIG. 15B shows an energy band model of the gate insulating film according to the second example.

FIG. 15A shows an energy band model of the gate insulating film according to the first embodiment. FIG. 15B shows an energy band model of the gate insulating film according to the second example.

In the gate insulating film 20A according to the first embodiment, the number of peaks of carbon concentration is one. On the other hand, in the gate insulating film 20C according to the second example, the number of peaks of carbon concentration is two.

In general, the permittivity of silicon oxycarbide (SiOC) tends to be lower than the permittivity of silicon oxide (SiO$_2$). The band offset of silicon oxycarbide (SiOC) tends to be smaller than the band offset of silicon oxide (SiO$_2$).

The energy band models of the gate insulating film according to the first embodiment and the second example derived from these facts are shown in FIGS. 15A and 15B. FIG. 15A has already been shown in FIG. 12B. The stepwise bands are labeled with symbols A, B, C, and D, respectively.

In the energy bands A, B, C, and D, of the gate insulating film 20C according to the second example shown in FIG. 15B, the permittivity does not increase stepwise from the semiconductor layer 10 side toward the gate electrode 60 side, but once decreases in the band C.

In other words, the gate insulating film 20C includes two bands A and C having a relatively low electron barrier. This is in agreement with the fact that the gate insulating film 20C has two peaks of carbon concentration. That is, peaks of carbon concentration exist in the bands A and C. Furthermore, in the gate insulating film 20C, the carbon concentration is $1 \times 10^{19}$ atoms/cm$^3$ or more everywhere. Thus, the electron barrier of the band D is lower than the electron barrier of the band D of the first embodiment. This is in agreement with the fact that while electrons easily flow from the semiconductor layer 10 side to the gate electrode 60 side, the charge retention characteristics are poorer than those of the first embodiment because the electron barrier is lower between the gate insulating film 20C and the gate electrode 60.

In contrast, in the gate insulating film 20A of the first embodiment shown in FIG. 15A, the electron barrier increases stepwise from the semiconductor layer 10 side to the gate electrode 60 side. Thus, electrons easily flow from the semiconductor layer 10 side to the gate electrode 60. Furthermore, a high electron barrier is formed between the gate insulating film 20A and the gate electrode 60. Thus, electrons do not easily flow from the gate electrode 60 side to the semiconductor layer 10. That is, the gate insulating film 20A of the first embodiment is superior in writing characteristics and charge retention characteristics to that of the second example.

Figure 16A:
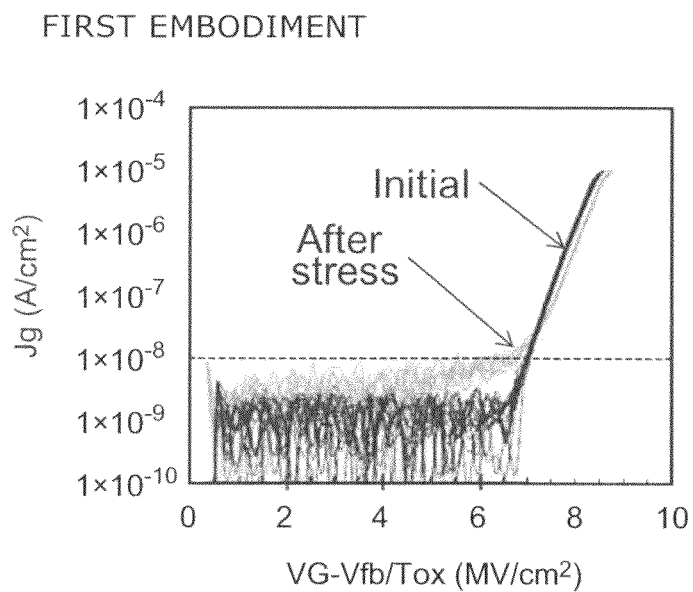
FIG. 16A shows a result of the stress test according to the first embodiment.
Figure 16B:
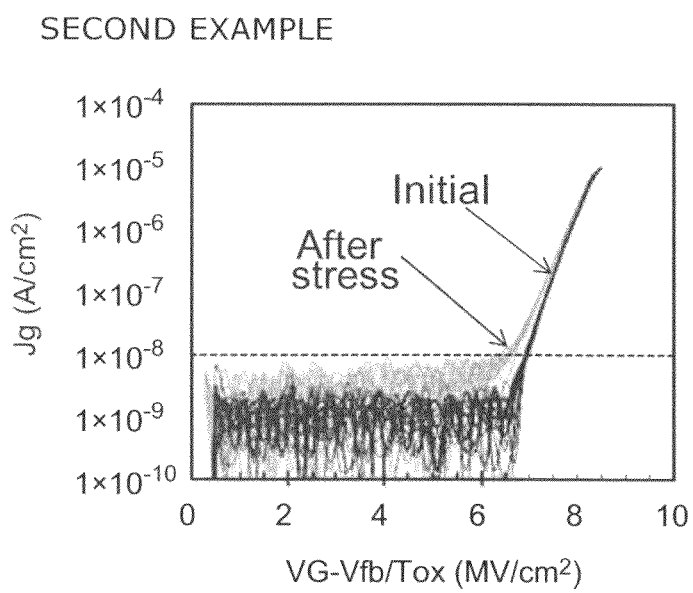
FIG. 16B shows a result of the stress test according to the second example.

FIG. 16A shows a result of the stress test according to the first embodiment. FIG. 16B shows a result of the stress test according to the second example.

FIG. 16A shows a J-E curve of the gate insulating film 20A according to the first embodiment. FIG. 16B shows a J-E curve of the gate insulating film 20C according to the second example. In the stress test, a current stress at 0.1 A/cm$^2$ for 5 seconds is applied to the gate insulating film.

In the gate insulating film 20A shown in FIG. 16A, the J-E curve does not significantly change before the stress test (Initial) and after the stress test (After stress).

In contrast, in the gate insulating film 20C shown in FIG. 16B, it is found that current leakage occurs at a lower electric field intensity after the stress test (After stress) than before the stress test (Initial). It is thus considered that by the current stress, the generation of electron trap sites is accelerated in the aforementioned band C of the gate insulating film 20C. That is, continuous use of the gate insulating film 20C may cause film damage.

Figure 17:
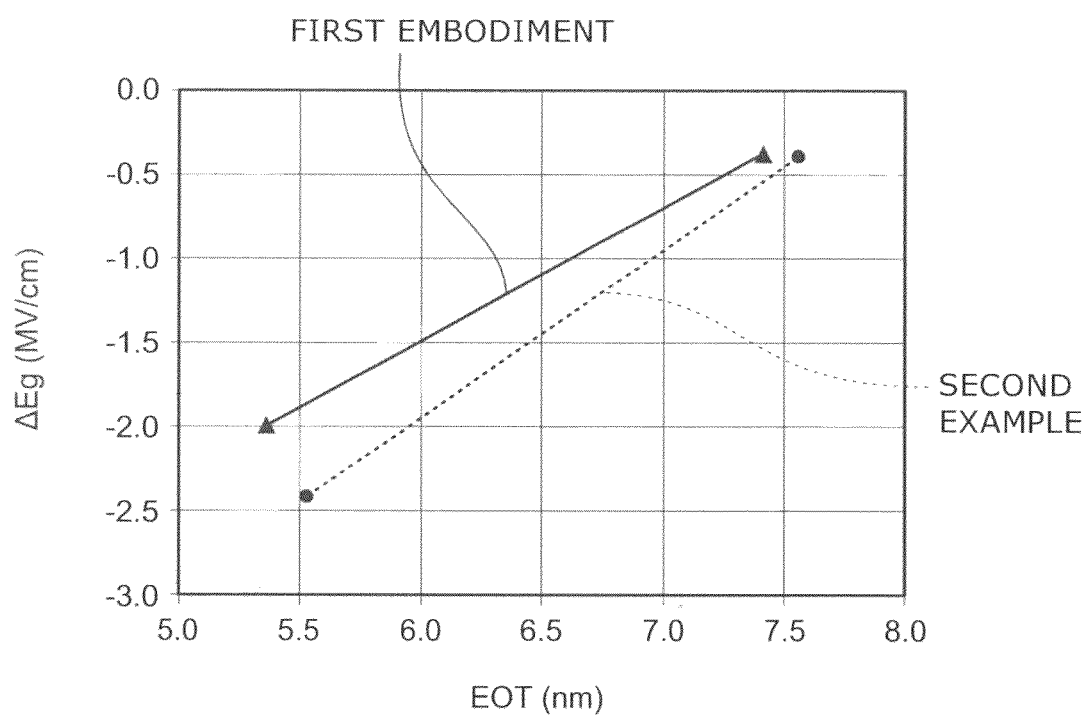
FIG. 17 shows the relationship between the film thickness of the gate insulating film and the difference in electron barrier.

FIG. 17 shows the relationship between the film thickness of the gate insulating film and the difference in electron barrier.

The horizontal axis represents the effective film thickness of the gate insulating film. The vertical axis represents the electric field intensity converted from the difference in leakage current ($\Delta$Eg=after stress test−before stress test) at a leakage current of $1\times10^{-8}$ A/cm$^2$ shown in FIGS. 16A and 16B.

As seen from FIG. 17, in the second example, it is found that with the decrease of film thickness, the difference in leakage current increases. It is thus considered that with the decrease of film thickness, the generation of electron trap sites is further accelerated.

On the other hand, in the first embodiment, it is found that even if the film thickness decreases, the difference in leakage current is smaller than in the second example. That is, it is found that the gate insulating film 20A is a film superior in stress resistance even if the film thickness is thinned.

Thus, according to the first embodiment, a concentration gradient is provided so that the carbon and nitrogen concentrations in the gate insulating film 20A are higher on the semiconductor layer 10 side and lower on the gate electrode 60 side. Thus, the electron barrier of the gate insulating film 20A changes with the concentration gradient. The permittivity of silicon oxide decreases on the semiconductor layer 10 side. Thus, the electric field applied to the surface of the semiconductor layer 10 can be increased without degradation of breakdown voltage.

Furthermore, the insulating film formed by CVD on the semiconductor layer 10 is modified by thermal oxidation to form the gate insulating film 20A. This suppresses generation of interface levels at the interface between the semiconductor layer 10 and the gate insulating film 20A. As a result, the generation of stress leakage current of the gate insulating film is suppressed.

Furthermore, carbon and nitrogen are contained in the silicon oxide-containing layer 21 formed by CVD technique, and the amorphous silicon-containing layer 22 is thermally oxidized. Thus, a gradient is provided to the carbon concentration and the nitrogen concentration in the gate insulating film 20A. Furthermore, the peak of the carbon concentration is set to $5\times10^{19}$ atoms/cm$^3$ on the semiconductor layer 10 side to optimally adjust the permittivity and the electron barrier in the gate insulating film 20A.

Furthermore, the permittivity and the electron barrier are decreased stepwise from the upper surface toward the lower surface of the gate insulating film 20A. Thus, the electric field at the end of the gate electrode can be increased even without thinning the physical film thickness of the gate insulating film 20A. That is, the gate insulating film 20A is superior in writing characteristics. Furthermore, even if the physical film thickness of the gate insulating film 20A is thinned, the permittivity is low near the lower surface of the gate insulating film 20A, and high near the upper surface. Thus, the gate insulating film 20A is superior in charge retention characteristics.

(Second Embodiment)

FIGS. 18A to 18D are schematic sectional views showing a process for manufacturing a nonvolatile semiconductor memory device according to a second embodiment.

Figure 18A:
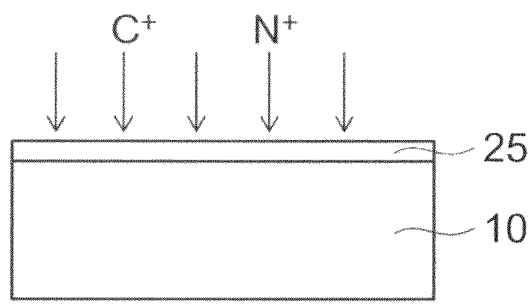
FIGS. 18A to 18D are schematic sectional views showing a process for manufacturing a nonvolatile semiconductor memory device according to a second embodiment.

First, a semiconductor layer 10 shown in FIG. 18A is prepared. The surface of this semiconductor layer 10 may be subjected to dilute hydrofluoric acid (DHF) treatment to remove natural oxide film.

Subsequently, at the surface layer of the semiconductor layer 10, a silicon oxide-containing layer 25 having a film thickness of 2 nm is formed by thermal oxidation technique. To this silicon oxide-containing layer 25, carbon or nitrogen is implanted by ion implantation technique.

Figure 18B:
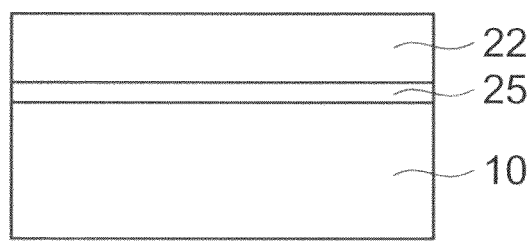

Next, as shown in FIG. 18B, on the silicon oxide-containing layer 25, by CVD, an amorphous silicon-containing layer 22 is formed.

Figure 18C:
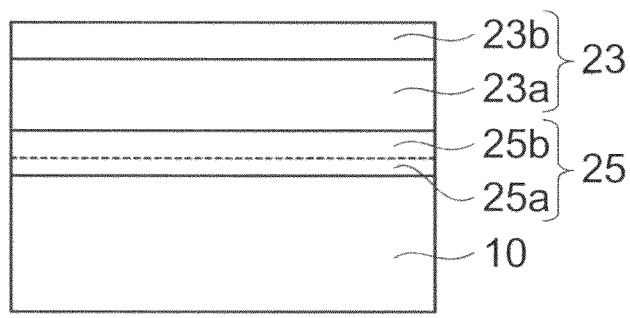

Next, as shown in FIG. 18C, in the atmosphere of an oxygen-containing gas (e.g., water vapor), the semiconductor layer 10, the silicon oxide-containing layer 25, and the amorphous silicon-containing layer 22 are heated at a temperature of e.g. 750° C. or less (e.g., 600° C.). The atmosphere pressure is e.g. 1 torr.

By this heating, the amorphous silicon-containing layer 22 transitions to a silicon oxide-containing layer 23.

Actually, by this heating, besides oxidation of the amorphous silicon-containing layer 22, interdiffusion of silicon and oxygen occurs between the semiconductor layer 10 and the silicon oxide-containing layer 25, and between the silicon oxide-containing layer 25 and the silicon oxide-containing layer 23. Thus, FIG. 18C shows that the silicon oxide-containing layer 25 includes a first portion 25a on the semiconductor layer 10 side and a second portion 25b on the silicon oxide-containing layer 23 side. The first portion 25a and the second portion 25b are both silicon oxide-containing layers, although the composition ratio is slightly different.

Furthermore, the silicon oxide-containing layer 23 includes a first portion 23a on the silicon oxide-containing layer 21 side and a second portion 23b in which oxidation has failed to sufficiently proceed at a temperature of 600° C. Thus, in the second embodiment, a second round of oxidation heating treatment is performed.

Figure 18D:
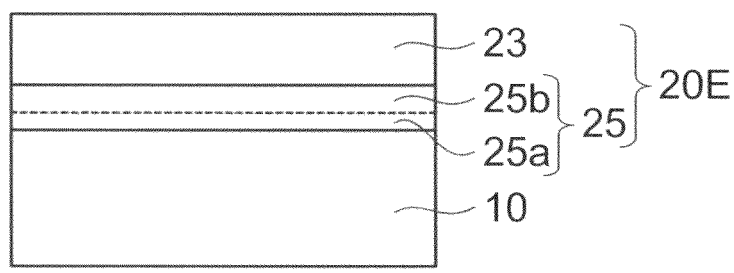

For instance, as shown in FIG. 18D, the semiconductor layer 10, the silicon oxide-containing layer 25, and the silicon oxide-containing layer 23 are again subjected to oxidation heating at a temperature higher than a temperature of 750° C. or less.

For instance, in the atmosphere of an oxygen-containing gas (e.g., water vapor), the semiconductor layer 10, the silicon oxide-containing layer 25, and the silicon oxide-containing layer 23 are heated at a temperature higher than a temperature of 750° C. or less. The temperature higher than a temperature of 750° C. or less is e.g. a temperature of 800° C. or more and 950° C. or less.

For instance, in the second embodiment, at a temperature of 900° C., in the atmosphere of the oxygen-containing gas, the semiconductor layer 10, the silicon oxide-containing layer 25, and the silicon oxide-containing layer 23 are heated.

Thus, a gate insulating film 20E including the silicon oxide-containing layer 25 and the silicon oxide-containing layer 23 is formed. Subsequently, on the gate insulating film 20E, a floating gate layer 30, a gate insulating film 40, and a gate electrode 60 are formed.

This gate insulating film 20E also exhibits a function and effect similar to those of the gate insulating film 20A.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
    a semiconductor layer;
    a first insulating film provided on the semiconductor layer;
    a floating gate layer provided on the first insulating film;
    a second insulating film provided on the floating gate layer; and
    a gate electrode provided on the second insulating film,
        the first insulating film including silicon, oxygen, and carbon,
        concentration of the carbon in a direction from the semiconductor layer side toward the floating gate layer side having a maximum directly below the floating gate layer, and
        the maximum being located nearer to the semiconductor layer side than to the floating gate layer side.

2. The device according to claim 1, wherein concentration profile of the carbon in the direction from the semiconductor layer side toward the floating gate layer side has one peak, and the concentration profile of the carbon reaches the maximum at the peak between the semiconductor layer and the floating gate layer.

3. The device according to claim 2, wherein the concentration of the carbon at position of the peak is $1\times10^{19}$ atoms/cm$^3$ or more.

4. The device according to claim 1, wherein
    the first insulating film further includes nitrogen,
    concentration of the nitrogen in the direction from the semiconductor layer side toward the floating gate layer side has a maximum between the semiconductor layer and the floating gate layer, and
    the maximum is located nearer to the semiconductor layer side than to the floating gate layer side.

5. The device according to claim 4, wherein the maximum of the concentration of the nitrogen is located nearer to the semiconductor layer side than to the floating gate layer side.

6. The device according to claim 1, wherein first permittivity of the first insulating film at interface in contact with the semiconductor layer is lower than second permittivity of the first insulating film at interface of the first insulating film in contact with the floating gate layer, and the permittivity of the first insulating film between the floating gate layer and the semiconductor is higher than or equal to the first permittivity, and lower than or equal to the second permittivity.

* * * * *